United States Patent
Huang et al.

(10) Patent No.: US 11,887,955 B2
(45) Date of Patent: Jan. 30, 2024

(54) SEMICONDUCTOR DIE INCLUDING STRESS-RESISTANT BONDING STRUCTURES AND METHODS OF FORMING THE SAME

(71) Applicant: Taiwan Semiconductor Manufacturing Company Limited, Hsinchu (TW)

(72) Inventors: Hui-Min Huang, Taoyuan (TW); Ming-Da Cheng, Taoyuan (TW); Chang-Jung Hsueh, Taipei (TW); Wei-Hung Lin, Xinfeng Township (TW); Kai Jun Zhan, Taoyuan (TW); Wan-Yu Chiang, Hsinchu (TW)

(73) Assignee: Taiwan Semiconductor Manufacturing Company Limited, Hsinchu (TW)

( * ) Notice: Subject to any disclaimer, the term of this patent is extended or adjusted under 35 U.S.C. 154(b) by 148 days.

(21) Appl. No.: 17/412,551

(22) Filed: Aug. 26, 2021

(65) Prior Publication Data
US 2023/0065797 A1 Mar. 2, 2023

(51) Int. Cl.
*H01L 23/522* (2006.01)
*H01L 23/00* (2006.01)

(52) U.S. Cl.
CPC .......... *H01L 24/13* (2013.01); *H01L 23/5226* (2013.01); *H01L 24/03* (2013.01); *H01L 24/05* (2013.01); *H01L 24/11* (2013.01); *H01L 2224/02181* (2013.01); *H01L 2224/03622* (2013.01); *H01L 2224/0401* (2013.01); *H01L 2224/05009* (2013.01); *H01L 2224/11622* (2013.01); *H01L 2224/13018* (2013.01)

(58) Field of Classification Search
CPC ....................................................... H01L 24/13
See application file for complete search history.

(56) References Cited

U.S. PATENT DOCUMENTS

2014/0021600 A1* 1/2014 Daubenspeck ......... H01L 24/06
257/737

* cited by examiner

*Primary Examiner* — William A Harriston
(74) *Attorney, Agent, or Firm* — The Marbury Law Group, PLLC

(57) ABSTRACT

A semiconductor die including mechanical-stress-resistant bump structures is provided. The semiconductor die includes dielectric material layers embedding metal interconnect structures, a connection pad-and-via structure, and a bump structure including a bump via portion and a bonding bump portion. The entirety of a bottom surface of the bump via portion is located within an area of a horizontal top surface of a pad portion of the connection pad-and-via structure.

20 Claims, 7 Drawing Sheets

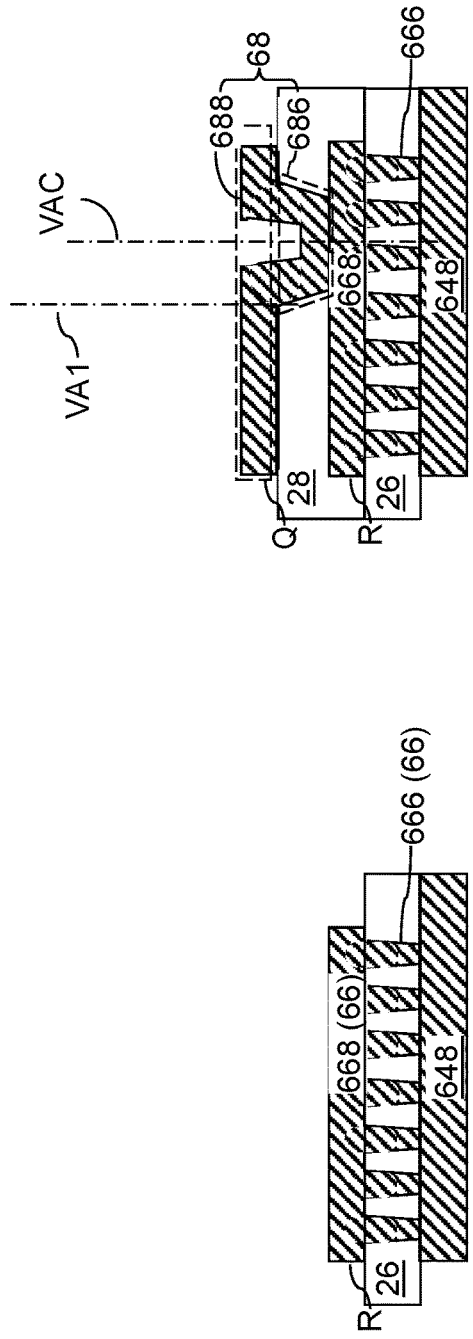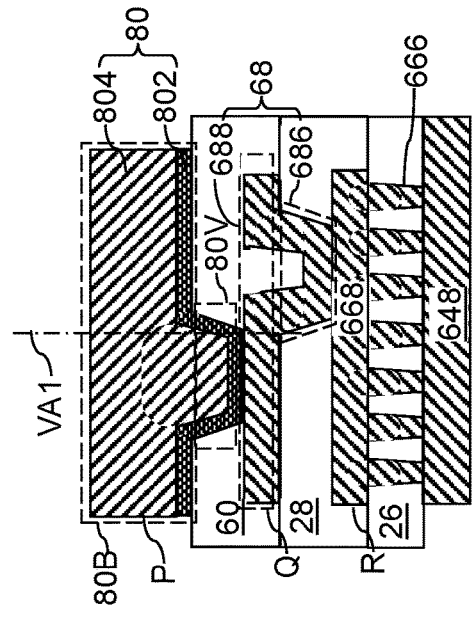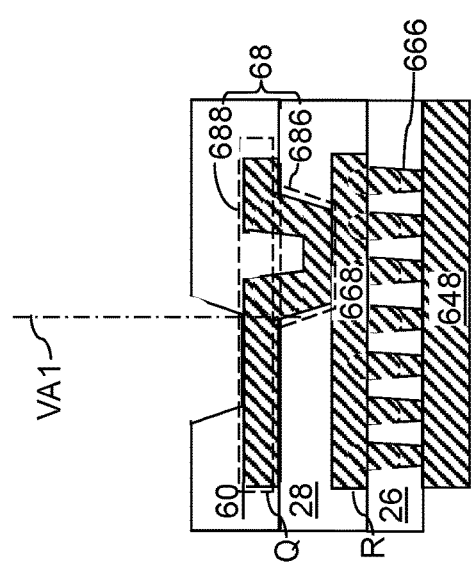

SEMICONDUCTOR DIE INCLUDING STRESS-RESISTANT BONDING STRUCTURES AND METHODS OF FORMING THE SAME

BACKGROUND

Bonding structures are employed to provide electrical connection to semiconductor dies.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 2A-2D are sequential vertical cross-sectional view of a portion of an semiconductor die that includes a bump structure during a manufacturing process according to an embodiment of the present disclosure.

DETAILED DESCRIPTION

Figure 1:
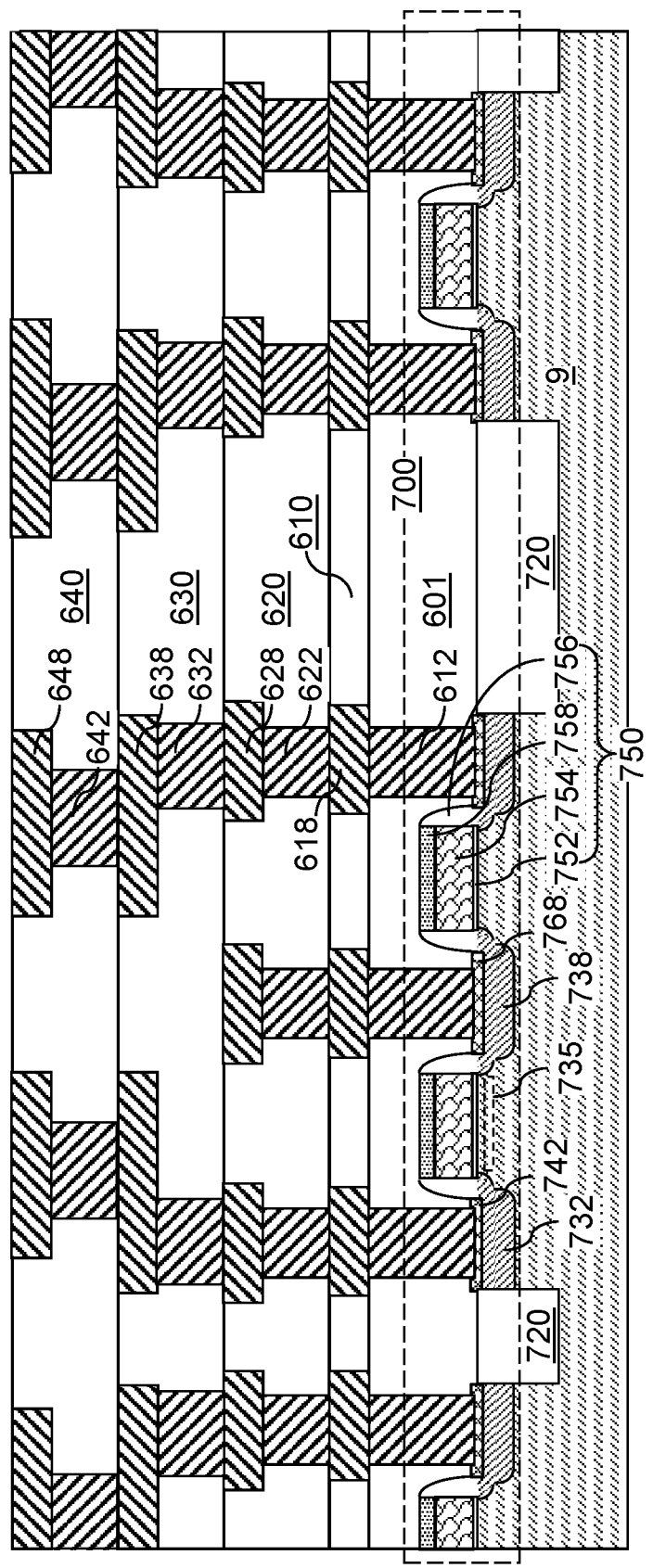
FIG. 1 is a vertical cross-sectional view of an exemplary structure after formation of complementary metal-oxide-semiconductor (CMOS) transistors, and metal interconnect structures embedded in dielectric material layers according to an embodiment of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. Unless explicitly stated otherwise, each element having the same reference numeral is presumed to have the same material composition and to have a thickness within a same thickness range.

The present disclosure is directed to semiconductor devices, and particularly to a semiconductor die including stress-resistant bonding structures and method of forming the same, the various aspects of which are now described in detail.

Generally, the methods and structures of the present disclosure may be used to provide a semiconductor die that may be resistant to stress-induced structural damage during subsequent handling of the semiconductor die such as attachment of the semiconductor die by C4 bonding or by wirebonding. According to an aspect of the present disclosure, connection pad-and-via structures and bump structures are formed such that a bump via portion of each bump structure is laterally offset from a connection via structure of an underlying connection pad-and-via structure. This geometrical offset allows absorption of mechanical stress during subsequent handling of the semiconductor die. The various aspects of the methods and structures of embodiments of the present disclosure are now described with reference to the accompanying drawings.

FIG. 1 is a vertical cross-sectional view of an exemplary structure after formation of complementary metal-oxide-semiconductor (CMOS) transistors, metal interconnect structures embedded in dielectric material layers, and a connection-via-level dielectric layer according to an embodiment of the present disclosure. The exemplary structure includes complementary metal-oxide-semiconductor (CMOS) transistors and metal interconnect structures formed in dielectric material layers. Specifically, the exemplary structure includes a semiconductor substrate 9, which may be a semiconductor substrate such as a commercially available silicon wafer. Shallow trench isolation structures 720 including a dielectric material such as silicon oxide may be formed in an upper portion of the semiconductor substrate 9. Suitable doped semiconductor wells, such as p-type wells and n-type wells, may be formed within each area that may be laterally enclosed by a portion of the shallow trench isolation structures 720. Field effect transistors may be formed over the top surface of the semiconductor substrate 9. For example, each field effect transistor may include a source region 732, a drain region 738, a semiconductor channel 735 that includes a surface portion of the semiconductor substrate 9 extending between the source region 732 and the drain region 738, and a gate structure 750. Each gate structure 750 may include a gate dielectric 752, a gate electrode 754, a gate cap dielectric 758, and a dielectric gate spacer 756. A source-side metal-semiconductor alloy region 742 may be formed on each source region 732, and a drain-side metal-semiconductor alloy region 768 may be formed on each drain region 738. While planar field effect transistors are illustrated in the drawings, embodiments are expressly contemplated herein in which the field effect transistors may additionally or alternatively include fin field effect transistors (FinFET), gate-all-around field effect (GAA FET) transistors, or any other type of field effect transistors (FETs).

The devices formed on the top surface of the semiconductor substrate 9 may include field effect transistors 700 such as complementary metal-oxide-semiconductor (CMOS) transistors. Additional semiconductor devices (such as resistors, diodes, capacitors, etc.) may be formed on the semiconductor substrate 9.

Various metal interconnect structures embedded in dielectric material layers may be subsequently formed over the semiconductor substrate 9 and the devices (such as field effect transistors). The dielectric material layers may include, for example, a contact-level dielectric material layer 601, a first metal-line-level dielectric material layer 610, a second line-and-via-level dielectric material layer 620, a third line-and-via-level dielectric material layer 630, and a fourth line-and-via-level dielectric material layer 640. The metal interconnect structures may include device contact via structures 612 formed in the contact-level dielectric material layer 601 and contact a respective component of the field effect transistors 700, first metal line structures 618 formed in the first metal-line-level dielectric material layer 610, first metal via structures 622 formed in a lower portion of the second line-and-via-level dielectric material layer 620, second metal line structures 628 formed in an upper portion of the second line-and-via-level dielectric material layer 620, second metal via structures 632 formed in a lower portion of the third line-and-via-level dielectric material layer 630, third metal line structures 638 formed in an upper portion of the third line-and-via-level dielectric material layer 630, third metal via structures 642 formed in a lower portion of the fourth line-and-via-level dielectric material layer 640, and fourth metal line structures 648 formed in an upper portion of the fourth line-and-via-level dielectric material layer 640.

Each of the dielectric material layers (601, 610, 620, 630, 640) may include a dielectric material such as undoped silicate glass, a doped silicate glass, organosilicate glass, amorphous fluorinated carbon, porous variants thereof, or combinations thereof. Each of the metal interconnect structures (612, 618, 622, 628, 632, 638, 642, 648) may include at least one conductive material, which may be a combination of a metallic liner layer (such as a metallic nitride or a metallic carbide) and a metallic fill material. Each metallic liner layer may include TiN, TaN, WN, TiC, TaC, and WC, and each metallic fill material portion may include W, Cu, Al, Co, Ru, Mo, Ta, Ti, alloys thereof, and/or combinations thereof. Other suitable materials within the contemplated scope of disclosure may also be used. In one embodiment, the first metal via structures 622 and the second metal line structures 628 may be formed as integrated line and via structures by a dual damascene process, the second metal via structures 632 and the third metal line structures 638 may be formed as integrated line and via structures, and/or the third metal via structures 642 and the fourth metal line structures 648 may be formed as integrated line and via structures. While the present disclosure is described using an embodiment in which an array of memory cells formed over the fourth line-and-via-level dielectric material layer 640, embodiments are expressly contemplated herein in which the array of memory cells may be formed at a different metal interconnect level.

The dielectric material layers (601, 610, 620, 630, 640) may be located at a lower level relative to an array of memory cells to be subsequently formed. As such, the dielectric material layers (601, 610, 620, 630, 640) are herein referred to as lower-level dielectric layers, i.e., dielectric material layer located at a lower level relative to the array of memory cells to be subsequently formed. The metal interconnect structures (612, 618, 622, 628, 632, 638, 642, 648) are herein referred to lower-level metal interconnect structures. A subset of the metal interconnect structures (612, 618, 622, 628, 632, 638, 642, 648) includes lower-level metal lines (such as the fourth metal line structures 648) that are embedded in the lower-level dielectric layers and having top surfaces within a horizontal plane including a topmost surface of the lower-level dielectric layers. Generally, the total number of metal line levels within the lower-level dielectric layers (601, 610, 620, 630, 640) may be in a range from 1 to 10.

FIGS. 2A-2D are sequential vertical cross-sectional view of a region of the semiconductor die that includes a bump structure during a manufacturing process according to an embodiment of the present disclosure.

Referring to FIG. 2A, additional metal interconnect levels may be employed to provide stress-absorption structures such as multi-via support structures (648, 666, 668). Each multi-via support structure (648, 666, 668) can be designed to distribute a mechanical stress transmitted from an overlying connection via structure to be subsequently formed over an area larger than the area of the overlying connection via structure. For example, each multi-via support structure (648, 666, 668) can include a bottom metallic plate (which may be, for example, a fourth metal line structures 648), and an integrated plate and via assembly (644, 668) that includes a top metallic plate 668 and a plurality of metallic via structures 666 that are adjoined to the top metallic plate 668 and contacting a top surface of the bottom metallic plate 668. The integrated plate and via assemblies (644, 668) can be formed by patterning an array of via cavities through the third dielectric material layer 26 over each area of the bottom metallic plates 668, by depositing at least one metallic material in the array of via cavities and over the third dielectric material layer 26, and by patterning the at least one metallic material. Each integrated plate and via assembly (644, 668) may have a planar top surface, i.e., a top surface located entirely within a horizontal plane. Each top metallic plate 668 can have a respective sidewall R, which defines a lateral extent of the top metallic plate 668.

Referring to FIG. 2B, another dielectric material layer, which is herein referred to as a pad-level dielectric material layer 28, can be deposited over the third dielectric material layer 26 and the third metal interconnect structures 66 (which include the integrated plate and via assemblies (644, 668)). The pad-level dielectric material layer 28 can include any material that may be employed for the underlying dielectric material layers (22, 24, 26). The thickness of the pad-level dielectric material layer 28 may be in a range from 2 microns to 20 microns, although lesser and greater thicknesses may also be used.

A connection via cavity can be formed over each of the integrated plate and via assemblies (644, 668) through the pad-level dielectric material layer 28, for example, by applying and patterning a photoresist layer and by transferring the pattern in the photoresist layer through the pad-level dielectric material layer 28 by performing an etch process such as a reactive ion etch process. A top surface of an integrated plate and via assembly (644, 668) can be physically exposed at the bottom of each connection via cavity. The maximum lateral dimension of each connection via cavity, such as a diameter of an upper periphery of each connection via cavity, can greater than twice the thickness of a metallic material layer to be subsequently deposited thereupon. For example, the maximum lateral dimension of each connection via cavity may be in a range from 5 microns to 100 microns, such as from 10 microns to 50 microns, although lesser and greater maximum lateral dimensions may also be employed.

The vertical axis passing through the geometrical center of each connection via cavity may be located at the geometrical center of a top surface of an underlying integrated plate and via assembly (644, 668), or may be laterally offset from the geometrical center of a top surface of an underlying integrated plate and via assembly (644, 668). A geometrical center of a two-dimensional object or a three-dimensional object is the point that corresponds to the average of all Cartesian coordinates of the two-dimensional object or the three-dimensional object, and can be obtained by calculating an integral of a Cartesian coordinates over the two-dimensional object and the three-dimensional object and dividing the integral by the total surface area of the total volume of the two-dimensional object or the three-dimensional object. While the drawings illustrate an embodiment in which the vertical axis passing through the geometrical center of a connection via cavity is laterally offset from the geometrical center of a top surface of an underlying integrated plate and via assembly (644, 668), embodiments are expressly contemplated herein in which the vertical axis passing through the geometrical center of a connection via cavity is located at the geometrical center of a top surface of an underlying integrated plate and via assembly (644, 668).

At least one metallic material such as Cu, Mo, Co, Ru, W, TiN, TaN, WN, or a combination or a stack thereof can be deposited in the connection via cavities and over the top surface of the pad-level dielectric material layer 28, for example, by physical vapor deposition. The thickness of the layer of the at least one metallic material can be less than the one half of the maximum lateral dimension of the upper periphery of each connection via cavity, and may be less than one half of the maximum lateral dimension of the lower periphery of each connection via cavity.

The at least one metallic material can be patterned, for example, by applying a photoresist layer over the at least one metallic material and by transferring the pattern in the photoresist layer through the at least one metallic material. Patterned portions of the at least one metallic material comprise connection pad-and-via structures 68 that contact a respective one of the multi-via support structures (648, 666, 668). Each connection pad-and-via structure 68 can comprise a connection via portion 686 located within a respective connection via cavity below a horizontal plane including a top surface of the pad-level dielectric material layer 28 and a pad portion 688 that contacts a horizontal top surface of the pad-level dielectric material layer 28 and located above the horizontal plane including the top surface of the pad-level dielectric material layer 28. Each connection via portion 686 of the connection pad-and-via structures 68 vertically extends through the pad-level dielectric material layer 28, and each pad portion 688 of the connection pad-and-via structures 68 overlies the pad-level dielectric material layer 28.

The maximum lateral dimension of each connection via portion 686 may be in a range from 10% to 90% of the maximum lateral dimension of an underlying multi-via support structure (648, 666, 668). In one embodiment, the maximum lateral dimension of each underlying multi-via support structure (648, 666, 668) may be in a range from 10 microns to 500 microns, and the maximum lateral dimension of each connection via portion 686 may be in a range from 3 microns to 450 microns, although lesser and greater dimensions may also be employed.

A dimple that is not filled with the at least one metallic material can be formed within each connection via portion 686 upon deposition of the metallic material. Each dimple comprises a volume of an unfilled void that is laterally surrounded by a respective one of the connection via portions 686. Each pad portion 688 of the connection pad-and-via structures 68 can have a sidewall Q, which defines the lateral extent of the pad portion 688. The sidewall Q of a pad portion 688 of a connection pad-and-via structures 68 may overlap with, may be laterally offset outward from, or may be laterally offset inward from, the sidewall P of an underlying top metallic plate 668. A first vertical axis VA1 passing through the geometrical center of a top metallic plate 668 may, or may not, coincide with a vertical axis VAC that passes through a geometrical center of the connection via portion 686 of an overlying connection pad-and-via structure 68. Each of the connection via portions 686 may have a taper angle (as measured from a vertical line) in a range from 3 degrees to 45 degrees, although lesser and greater taper angles may also be employed.

Referring to FIG. 2C, a bump-level dielectric material layer 60 can be formed over the connection pad-and-via structures 68 and the pad-level dielectric material layer 28. The bump-level dielectric material layer 60 can include any material that may be employed for the underlying dielectric material layers (22, 24, 26, 28), which are collectively referred to as dielectric material layers. The thickness of the bump-level dielectric material layer 60 may be in a range from 2 micron to 20 microns, although lesser and greater thicknesses may also be employed.

Bump via cavities can be formed through the bump-level dielectric material layer 60, for example, by applying a photoresist layer over the bump-level dielectric material layer 60, lithographically patterning the photoresist layer to form discrete openings therethrough in areas that overlap with top surface of the pad portions 688 of the connection pad-and-via structures 68, and by etching unmasked portions of the bump-level dielectric material layer 60 employing the patterned photoresist layer as an etch mask. Each bump via cavity may have a taper angle (as measured from a vertical line) in a range from 3 degrees to 45 degrees, although lesser and greater taper angles may also be employed. In one embodiment, the geometrical center of each bump via cavity may be laterally offset from the first vertical axis VA1 passing through the geometrical center of an underlying top metallic plate 668. The maximum lateral dimension of a bottom surface of each bump via cavity may be in a range from 10% to 70%, such as from 15% to 50%, of the maximum lateral dimension of the underlying multi-via support structure (648, 666, 668).

Referring to FIG. 2D, at least one metallic material may be deposited in the bump via cavities and over the top surface of the bump-level dielectric material layer 60. The at least one metallic material may include a metallic liner layer and a copper layer. The metallic liner layer may include a material such as Ti, Ta, W, TiN, TaN, WN, or a combination thereof, and may have a thickness in a range from 30 nm to 300 nm. The copper layer may have a thickness in a range from 10 microns to 60 microns, although lesser and greater thicknesses may also be employed.

A photoresist layer may be applied over the at least one metallic material, and may be lithographically patterned to cover discrete areas that include the area of a respective one of the bump via cavities (which are filled with the at least one metallic material at this processing step). An anisotropic etch process can be performed to etch unmasked portions of the at least one metallic material. Each patterned portion of the at least one metallic material comprise a bump structure 80. Each bump structure 80 may comprise a metallic liner 802 and a copper portion 804. Structurally, each bump structure 80 may include a bump via portion 80V extending through the bump-level dielectric material layer 60 and contacting a pad portion 688 of an underlying connection pad-and-via structure 68 and a bonding bump portion 80B overlying the bump-level dielectric material layer 60 and contacting a top surface of the bump-level dielectric material layer 60. In one embodiment, the bonding bump portion 80B may have a circular cylindrical shape, i.e., a cylindrical shape having a horizontal cross-sectional shape of a circle. Each bonding bump portion 80B may have a sidewall P having a shape of a cylindrical surface. The maximal lateral dimension of each bonding bump portion 80B may be in a range from 60% to 120% of the maximum lateral dimension of the underlying multi-via support structure (648, 666, 668). The maximal lateral dimension of the bonding bump portion 80B of a bump structure 80 may be in a range from 110% to 500% of the maximum lateral dimension of the bump via portion 80V of the bump structure 80.

Figure 3A:
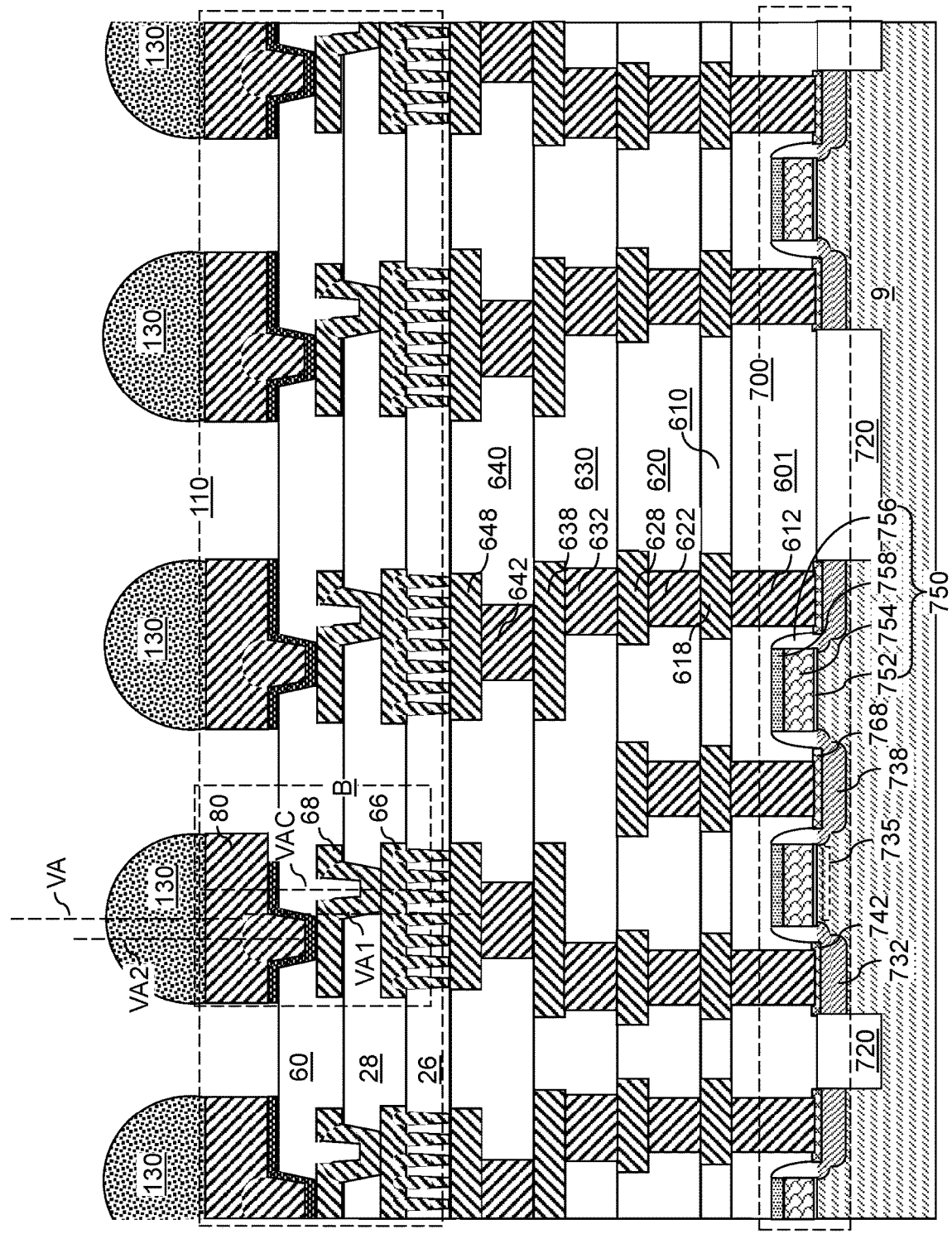
FIG. 3A is a vertical cross-sectional view of the exemplary structure after formation of bump structures according to an embodiment of the present disclosure.
Figure 3C:
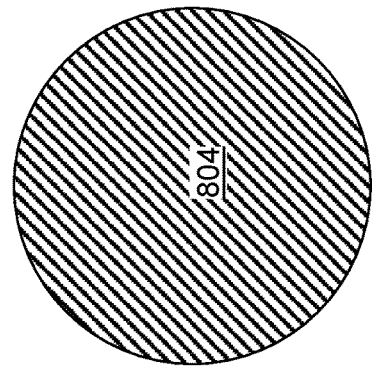
FIG. 3C is a horizontal cross-sectional view of a portion of the exemplary structure along the horizontal plane C-C' of FIG. 3B.
Figure 3E:
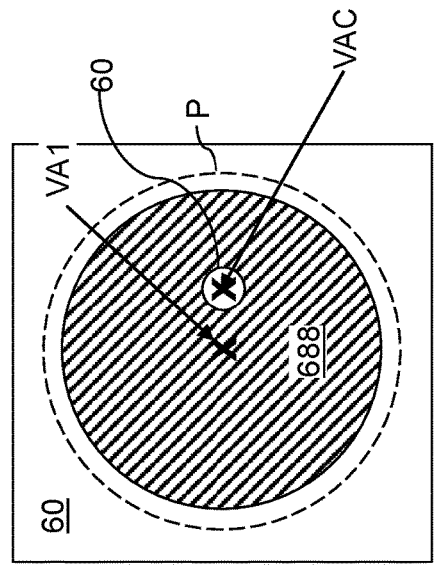
FIG. 3E is a horizontal cross-sectional view of a portion of the exemplary structure along the horizontal plane E-E' of FIG. 3B.
Figure 3B:
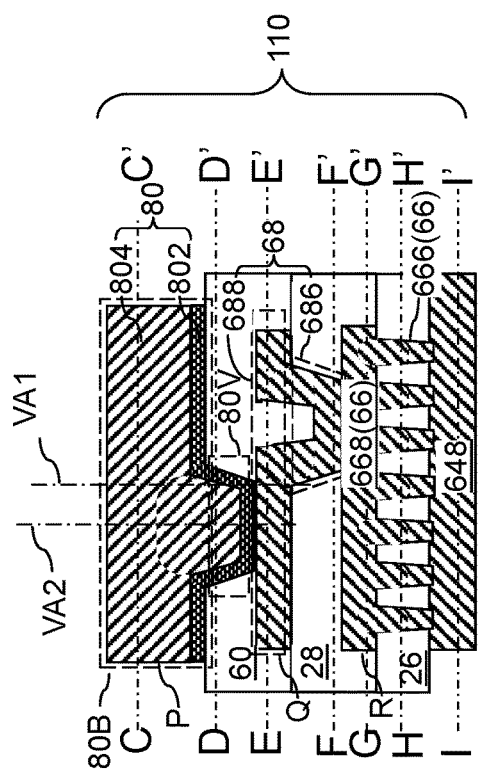
FIG. 3B is a magnified view of region B of FIG. 3A.
Figure 3D:
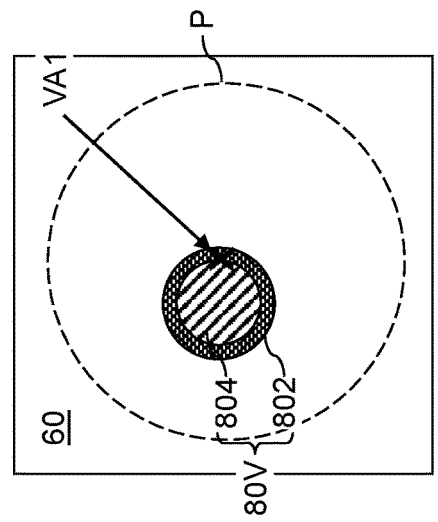
FIG. 3D is a horizontal cross-sectional view of a portion of the exemplary structure along the horizontal plane D-D' of FIG. 3B.
Figure 3G:
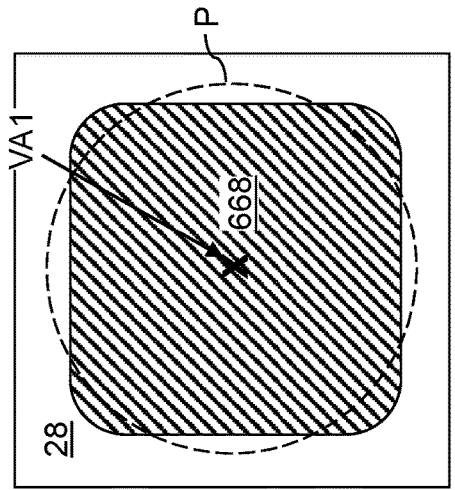
FIG. 3G is a horizontal cross-sectional view of a portion of the exemplary structure along the horizontal plane G-G' of FIG. 3B.
Figure 3I:
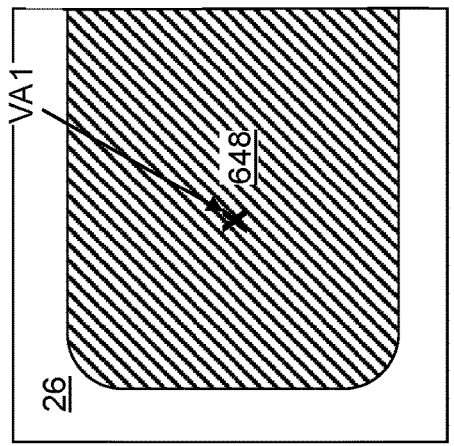
FIG. 3I is a horizontal cross-sectional view of a portion of the exemplary structure along the horizontal plane I-I' of FIG. 3B.
Figure 3F:
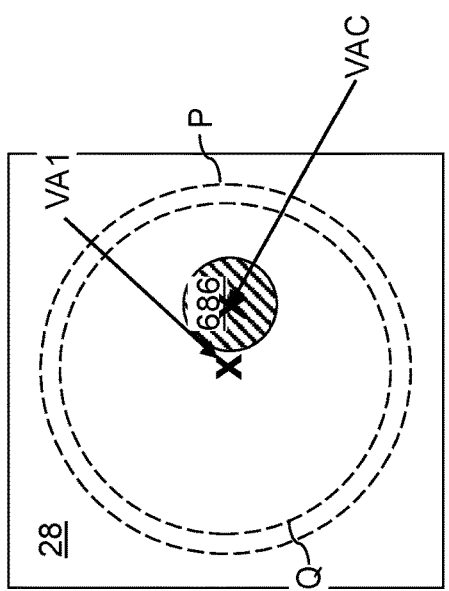
FIG. 3F is a horizontal cross-sectional view of a portion of the exemplary structure along the horizontal plane F-F' of FIG. 3B.
Figure 3H:
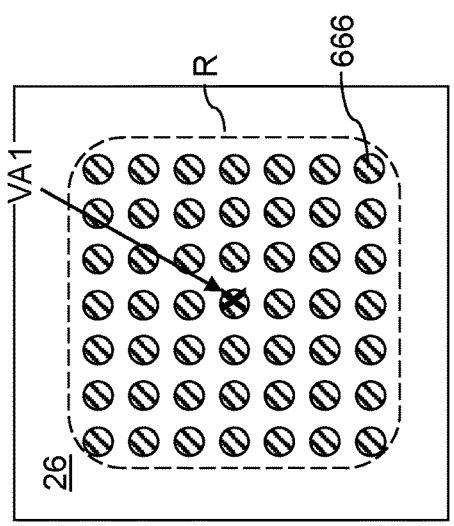
FIG. 3H is a horizontal cross-sectional view of a portion of the exemplary structure along the horizontal plane H-H' of FIG. 3B.

The exemplary structure illustrated in FIGS. 3A-3J can be formed by performing the processing steps of FIGS. 2A-2D on the exemplary structure of FIG. 1, and by subsequently performing additional processing steps. FIG. 3A is a vertical cross-sectional view of the exemplary structure after formation of the pad-level structure 110 according to an embodiment of the present disclosure. FIG. 3B is a magnified view of region B of FIG. 3A. FIG. 3C is a horizontal cross-sectional view of a portion of the exemplary structure along the horizontal plane C-C' of FIG. 3B. FIG. 3D is a horizontal cross-sectional view of a portion of the exemplary structure along the horizontal plane D-D' of FIG. 3B. FIG. 3E is a horizontal cross-sectional view of a portion of the exemplary structure along the horizontal plane E-E' of FIG. 3B. FIG. 3F is a horizontal cross-sectional view of a portion of the exemplary structure along the horizontal plane F-F' of FIG. 3B. FIG. 3G is a horizontal cross-sectional view of a portion of the exemplary structure along the horizontal plane G-G' of FIG. 3B. FIG. 3H is a horizontal cross-sectional view of a portion of the exemplary structure along the horizontal plane H-H' of FIG. 3B. FIG. 3I is a horizontal cross-sectional view of a portion of the exemplary structure along the horizontal plane I-I' of FIG. 3B. FIG. 3J is a schematic top-down view of a portion of the exemplary structure of FIG. 3B.

A pad-level structure 110 can be formed over the structure of FIG. 1. A solder material portion 130 can be formed on each bump structure 80. Each solder material portion 130 can include a solder material such as an alloy including tin and silver. The vertical axis VA passing through a geometric center of a solder material portion 130 may coincide with the vertical axis VA passing through a geometrical center of an underlying bonding bump portion 80B of a bump structure 80.

According to an aspect of the present disclosure, the semiconductor die can comprise: dielectric material layers embedding metal interconnect structures; a connection pad-and-via structure 68 located on a first side of the dielectric material layers, wherein the connection pad-and-via structure 68 comprises a connection via portion 686 that vertically extending through a pad-level dielectric material layer 28 and contacting one of the metal interconnect structures and a pad portion 688 contacting a horizontal surface of the pad-level dielectric material layer 28; a bump-level dielectric material layer 60 overlying the connection pad-and-via structure 68; and a bump structure 80 located on the bump-level dielectric material layer 60 and comprising a bump via portion 80V extending through the bump-level dielectric material layer 60 and contacting the pad portion 688, wherein an entirety of a bottom surface of the bump via portion 80V is located within an area of a horizontal top surface of the pad portion 688 of the connection pad-and-via structure 68.

In one embodiment, a lateral distance between opposing segments of an outer sidewall of the connection via portion 686 (such as a maximum lateral dimension of the connection via portion 686) can be greater than twice a thickness of the pad portion 688 of the connection pad-and-via structure 68. In one embodiment, the bottom surface of the bump via portion 80V is laterally offset from, and does not contact, a top periphery of a dimple located within the connection via portion 686. In one embodiment, an entire volume of the dimple is filled with the bump-level dielectric material layer 60.

In one embodiment, a bottom surface of the bump via portion 80V and a bottom surface of the connection via portion 686 do not have any areal overlap in a plan view along a vertical direction. A plan view refers to a view along a vertical direction that is perpendicular to the horizontal direction.

In one embodiment, a geometrical center of a bottom surface of the bump via portion 80V is laterally offset from a geometrical center of a bonding bump portion 80B of the bump structure 80 that overlies a top surface of the bump-level dielectric material layer 60. In one embodiment, a geometrical center of a bottom surface of the connection via portion 686 is laterally offset from a geometrical center of a two-dimensional shape including an outer periphery of a bottom surface of the pad portion 688 of the connection pad-and-via structure 68.

In one embodiment, the one of the metal interconnect structures comprises a multi-via support structure (648, 666, 668) comprising: a bottom metallic plate 668; and an integrated plate and via assembly (666, 668) that includes a top metallic plate 668 and a plurality of metallic via structures 666 adjoined to the top metallic plate 668 and contacting a top surface of the bottom metallic plate 668. The integrated plate and via assembly (666, 668) may be formed as an integral structure in which a metallic material portion continuously extends therethrough without interfaces between the top metallic plate 668 and the plurality of metallic via structures 666. In one embodiment, the field effect transistors 700 can be located on the semiconductor substrate 9, and can be electrically connected to a subset of the metal interconnect structures (612, 618, 622, 628, 632, 638, 642, 648).

In one embodiment, the sidewall P of a bonding bump portion 80B may coincide with, may be located within, or may be located outside, the sidewall of the connection pad-and-via structure 68. The geometrical center GC2 of the horizontal cross-sectional shape of the bump via portion 80V can be laterally offset from the first vertical axis VA1 passing through the geometrical center of the top metallic plate 668 that underlies the bump via portion 80V as illustrated in FIG. 3J. The geometrical center GC1 of the connection via portion 686 of the connection pad-and-via structure 68 can be laterally offset from the first vertical axis VA1 passing through the geometrical center of the top metallic plate 668 that underlies the bump via portion 80V along an opposite direction of the lateral offset of the geometrical center GC2 of the horizontal cross-sectional shape of the bump via portion 80V from the first vertical axis VA1 as illustrated in FIG. 3J. In one embodiment, the areal overlap between the bottom surface of the bump via portion 80V of the bump structure 80 may not have any areal overlap with the area of the bottom surface of the connection via portion 686 of the connection pad-and-via structure 68 as illustrated in FIG. 3J.

Figure 3K:
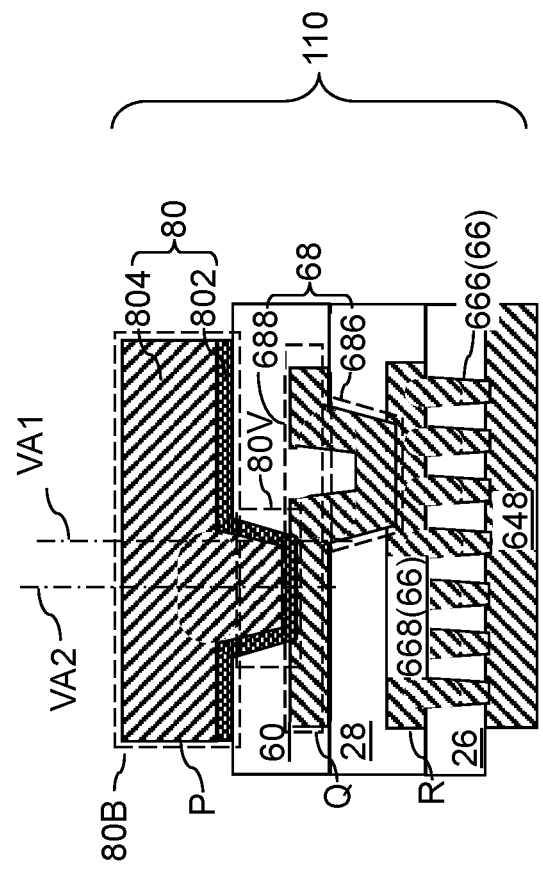
FIG. 3K is a vertical cross-sectional view of an alternative embodiment of the exemplary structure after formation of bump structures according to an embodiment of the present disclosure.
Figure 3J:
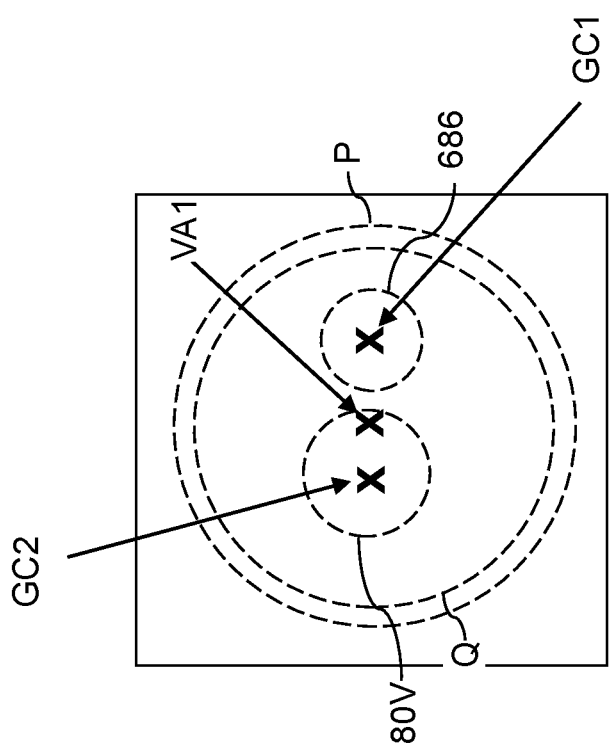
FIG. 3J is a schematic top-down view of a portion of the exemplary structure of FIG. 3B.

FIG. 3K illustrates an alternative embodiment of the exemplary structure in which am overetch process is employed to pattern via cavities in which the connection via portions 686 are formed, and/or an overetch process is employed to form bump via portions 80V. In this case, a bottom surface of each connection via portion 686 may be vertically recessed relative to a horizontal plane including a top surface of a top metallic plate 668 in contact with the respective connection via portion 686. Alternatively or additionally, a bottom surface of each bump via portion 80V may be vertically recessed relative to a horizontal plane including a top surface of a pad portion 688 in contact with the respective bump via portion 80V.

According to another aspect of the present disclosure, a semiconductor structure comprising a semiconductor die is provided. The semiconductor die comprises dielectric material layers (601, 610, 620, 630, 640) embedding metal interconnect structures (612, 618, 622, 628, 632, 638, 642, 648) and a bump structure 80 that includes a bonding bump portion 80B and a bump via portion 80V extending toward the metal interconnect structures (612, 618, 622, 628, 632, 638, 642, 648); a solder material portion 130 is attached to the bump structure 80; and a vertical axis VA passing through a geometrical center of the solder material portion 130 is laterally offset from a vertical axis VA2 passing through a geometrical center of the bump via portion 80V.

In one embodiment, the semiconductor die comprises a connection pad-and-via structure 68 located between the bump via portion 80V and the metal interconnect structures (612, 618, 622, 628, 632, 638, 642, 648) and comprising a connection via portion 686 that vertically extends through a pad-level dielectric material layer 28 and contacts one of the metal interconnect structures (612, 618, 622, 628, 632, 638, 642, 648) and comprising a pad portion 688 contacting a horizontal surface of the pad-level dielectric material layer 288 and contacting the bump via portion 80V.

The various structures and methods of the present disclosure may be used to provide a stress-resistant semiconductor die that deforms less during an underfill process and/or subsequent handling processes.

Figure 4:
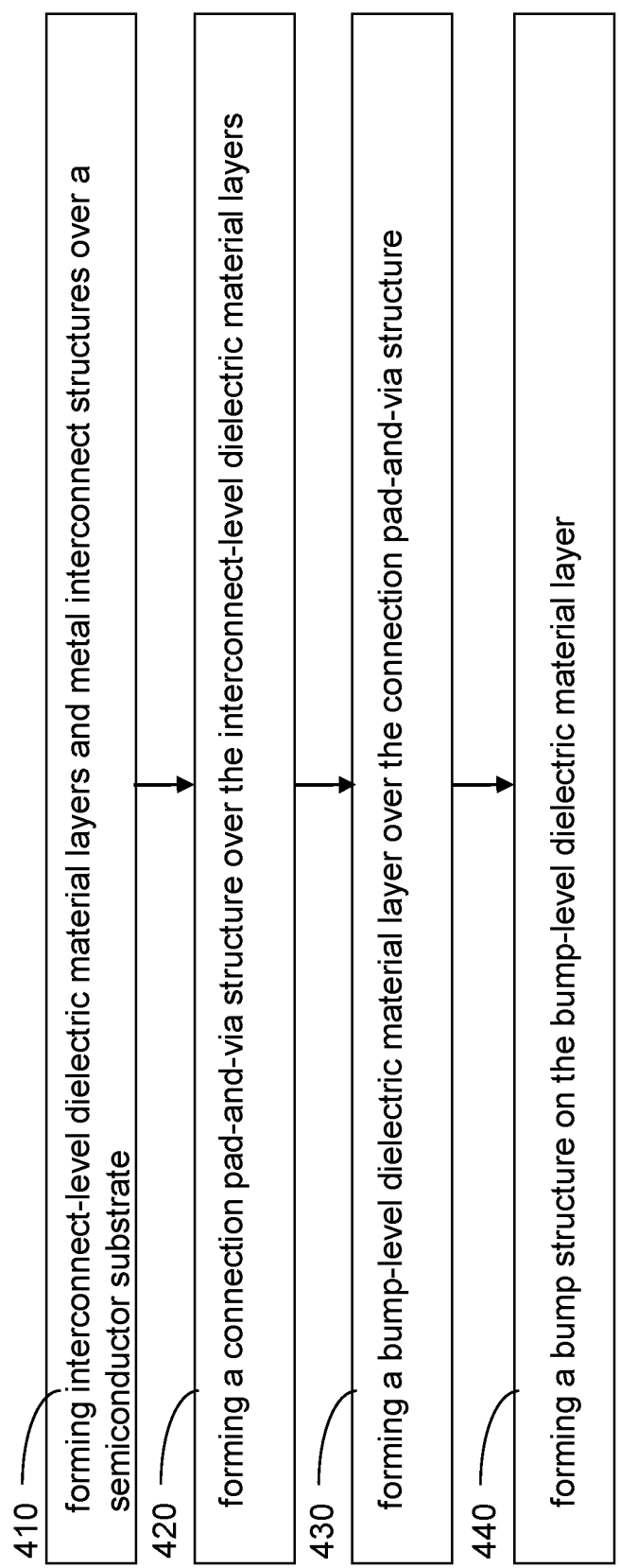
FIG. 4 is a flowchart illustrating steps for forming an semiconductor die according to an embodiment of the present disclosure.

Referring to FIG. 4, a flowchart illustrates a method of forming a semiconductor structure including a semiconductor die according to an embodiment of the present disclosure. Referring to step 410 and FIG. 1, dielectric material layers (601, 610, 620, 630, 640, 26, 28) and metal interconnect structures (612, 618, 622, 628, 632, 638, 642, 648) can be formed over a semiconductor substrate 9. The dielectric material layers comprise a pad-level dielectric material layer 28. Referring to step 420 and FIGS. 2A-2D and 3A-3J, a connection pad-and-via structure 68 can be formed over the dielectric material layers (601, 610, 620, 630, 640, 26, 28). The connection pad-and-via structure 68 comprises a connection via portion 686 that extends through the pad-level dielectric material layer 28 and a pad portion 688 that overlies the pad-level dielectric material layer 28. Referring to step 430 and FIGS. 2A-2D and 3A-3J, a bump-level dielectric material layer 60 can be formed over the connection pad-and-via structure 68. Referring to step 440 and FIGS. 2A-2D and 3A-3J, a bump structure 80 can be formed on the bump-level dielectric material layer 60. The bump structure 80 comprises a bump via portion 80V extending through the bump-level dielectric material layer 60 and contacting the pad portion 688 and a bonding bump portion 80B overlying the bump-level dielectric material layer 60. A vertical axis VA2 passing through a geometrical center of the bump via portion 80V is laterally offset from a vertical axis VAC passing through a geometric center of the connection via portion 686 of the connection pad-and-via structure 68 by a lateral offset distance, which may be in a range from 0.1 times a maximum lateral dimension of the top metallic plate 668 to 0.9 times the maximum lateral dimension of the top metallic plate 668, although lesser and greater lateral offset distances may also be employed.

The various embodiments of the present disclosure can be employed to form connection pad-and-via structures that provide enhanced structural support to bump structures, and reduces structural deformation of connection pad-and-via structures and underlying metal interconnect structures.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor die comprising:
   dielectric material layers embedding metal interconnect structures;
   a connection pad-and-via structure located on a first side of the dielectric material layers, wherein the connection pad-and-via structure comprises a connection via portion that vertically extending through a pad-level dielectric material layer and contacting one of the metal interconnect structures and a pad portion contacting a horizontal surface of the pad-level dielectric material layer;
   a bump-level dielectric material layer overlying the connection pad-and-via structure; and
   a bump structure located on the bump-level dielectric material layer and comprising a bump via portion extending through the bump-level dielectric material layer and contacting the pad portion, wherein an entirety of a bottom surface of the bump via portion is located within an area of a horizontal top surface of the pad portion of the connection pad-and-via structure, wherein a lateral distance between opposing segments of an outer sidewall of the connection via portion is greater than twice a thickness of the pad portion of the connection pad-and-via structure.

2. The semiconductor die of claim 1, wherein the bottom surface of the bump via portion is laterally offset from, and does not contact, a top periphery of a dimple located within the connection via portion.

3. The semiconductor die of claim 2, wherein an entire volume of the dimple is filled with the bump-level dielectric material layer.

4. The semiconductor die of claim 1, wherein a bottom surface of the bump via portion and a bottom surface of the connection via portion do not have any areal overlap in a plan view along a vertical direction.

5. The semiconductor die of claim 1, wherein a geometrical center of a bottom surface of the bump via portion is laterally offset from a geometrical center of a bonding bump portion of the bump structure that overlies a top surface of the bump-level dielectric material layer.

6. The semiconductor die of claim 5, wherein a geometrical center of a bottom surface of the connection via portion is laterally offset from a geometrical center of a two-dimensional shape including an outer periphery of a bottom surface of the pad portion of the connection pad-and-via structure.

7. The semiconductor die of claim 1, wherein the one of the metal interconnect structures comprises a multi-via support structure comprising:
    a bottom metallic plate; and
    an integrated plate and via assembly that includes a top metallic plate and a plurality of metallic via structures adjoined to the top metallic plate and contacting a top surface of the bottom metallic plate.

8. The semiconductor die of claim 1, further comprising field effect transistors located on the semiconductor substrate and electrically connected to a subset of the metal interconnect structures.

9. A semiconductor structure comprising a semiconductor die, wherein:
    the semiconductor die comprises dielectric material layers embedding metal interconnect structures and a bump structure that includes a bonding bump portion and a bump via portion extending toward the metal interconnect structures, and further comprises a connection pad-and-via structure located between the bump via portion and the metal interconnect structures and comprising a connection via portion that vertically extends through a pad-level dielectric material layer and contacts one of the metal interconnect structures and comprising a pad portion contacting a horizontal surface of the pad-level dielectric material layer and contacting the bump via portion;
    a solder material portion is attached to the bump structure; and
    a vertical axis passing through a geometrical center of the solder material portion is laterally offset from a vertical axis passing through a geometrical center of the bump via portion.

10. The semiconductor structure of claim 9, wherein a lateral distance between opposing segments of an outer sidewall of the connection via portion is greater than twice a thickness of the pad portion of the connection pad-and-via structure.

11. The semiconductor structure of claim 10, wherein a bottom surface of the bump via portion is laterally offset from, and does not contact, a top periphery of a dimple located within the connection via portion.

12. The semiconductor die of claim 1, wherein the connection via portion is located entirely within an area of enclosed by a periphery of the bump structure in a plan view along a vertical direction.

13. The semiconductor structure of claim 10, wherein the connection via portion is located entirely within an area of enclosed by a periphery of the bump structure in a plan view along a vertical direction.

14. A method of forming a semiconductor structure including a semiconductor die, comprising:
    forming dielectric material layers and metal interconnect structures over a semiconductor substrate, wherein the dielectric material layers comprise a pad-level dielectric material layer;
    forming a connection via cavity through the pad-level dielectric material layer;
    forming a connection pad-and-via structure over the dielectric material layers by depositing and patterning a metallic material having a thickness less than one half of a maximum lateral dimension of the connection via cavity in the connection via cavity and over the pad-level dielectric material layer, wherein a dimple that is not filled with the metallic material is formed within the connection via portion upon deposition of the metallic material, wherein the connection pad-and-via structure comprises a connection via portion that extends through the pad-level dielectric material layer and a pad portion that overlies the pad-level dielectric material layer;
    forming a bump-level dielectric material layer over the connection pad-and-via structure, wherein the dimple is filled with a dielectric material of the bump-level dielectric material layer; and
    forming a bump structure on the bump-level dielectric material layer, wherein the bump structure comprises a bump via portion extending through the bump-level dielectric material layer and contacting the pad portion and a bonding bump portion overlying the bump-level dielectric material layer, wherein a vertical axis passing through a geometrical center of the bump via portion is laterally offset from a vertical axis passing through a geometric center of the connection via portion of the connection pad-and-via structure.

15. The method of claim 14, wherein an entirety of a bottom surface of the bump via portion is formed within an area of a horizontal top surface of the pad portion of the connection pad-and-via structure.

16. The method of claim 14, wherein a bottom surface of the bump via portion is laterally offset from, and does not contact, an upper periphery of the dimple.

17. The method of claim 14, wherein the bump via portion is formed such that entirety of a bottom surface of the bump via portion does not have any areal overlap with an area of a bottom surface of the connection via portion of the connection pad-and-via structure.

18. The method of claim 14, further comprising bonding a semiconductor die to an substrate such that a bump structure of the semiconductor die is bonded via a solder material portion, wherein a vertical axis passing through a geometrical center of the solder material portion is laterally offset from the vertical axis passing through the geometric center of the connection via portion of the connection pad-and-via structure.

19. The method of claim 14, wherein the connection via portion is formed entirely within an area of enclosed by a periphery of the bump structure in a plan view along a vertical direction.

20. The method of claim 14, wherein:
- one of the metal interconnect structures comprises a multi-via support structure which comprises a bottom metallic plate, and further comprises an integrated plate and via assembly that includes a top metallic plate and a plurality of metallic via structures adjoined to the top metallic plate and contacting a top surface of the bottom metallic plate; and
- the connection via portion is formed on a top surface of the top metallic plate.

* * * * *